United States Patent
Hsiao et al.

(10) Patent No.: US 7,022,573 B2
(45) Date of Patent: Apr. 4, 2006

(54) STACK GATE WITH TIP VERTICAL MEMORY AND METHOD FOR FABRICATING THE SAME

(75) Inventors: Ching-Nan Hsiao, Kaohsiung (TW); Ying-Cheng Chuang, Bade (TW); Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 27 days.

(21) Appl. No.: 10/884,701

(22) Filed: Jul. 2, 2004

(65) Prior Publication Data
US 2004/0245562 A1    Dec. 9, 2004

Related U.S. Application Data

(62) Division of application No. 10/606,702, filed on Jun. 26, 2003, now Pat. No. 6,870,216.

(30) Foreign Application Priority Data
Jan. 17, 2003   (TW) .............................. 92100981 A

(51) Int. Cl.
*H01L 21/336*   (2006.01)
(52) U.S. Cl. ...................... 438/259; 438/201; 438/257; 438/260; 438/262; 438/267
(58) Field of Classification Search ................ 438/201, 438/257, 259, 260, 262, 267; 257/314, 315, 257/317
See application file for complete search history.

(56) References Cited

U.S. PATENT DOCUMENTS

| 5,468,663 | A  | * | 11/1995 | Bertin et al. ................. 438/259 |
| 5,705,415 | A  | * | 1/1998  | Orlowski et al. ............ 438/259 |
| 6,255,689 | B1 | * | 7/2001  | Lee .............................. 257/314 |
| 6,444,525 | B1 | * | 9/2002  | Lee .............................. 438/259 |
| 6,781,191 | B1 | * | 8/2004  | Lin .............................. 257/321 |
| 6,818,948 | B1 | * | 11/2004 | Lin .............................. 257/330 |

* cited by examiner

*Primary Examiner*—Kenneth Parker
*Assistant Examiner*—José R. Diaz
(74) *Attorney, Agent, or Firm*—Quintero Law Office

(57) ABSTRACT

A stacked gate vertical flash memory and a fabrication method thereof. The stacked gate vertical flash memory comprises a semiconductor substrate with a trench, a source conducting layer formed on the bottom of the trench, an insulating layer formed on the source conducting layer, a gate dielectric layer formed on a sidewall of the trench, a conducting spacer covering the gate dielectric layer as a floating gate, an inter-gate dielectric layer covering the conducting spacer, and a control gate conducting layer filled in the trench.

8 Claims, 8 Drawing Sheets

US 7,022,573 B2

STACK GATE WITH TIP VERTICAL MEMORY AND METHOD FOR FABRICATING THE SAME

This application is a divisional of U.S. application Ser. No. 10/606,702 filed Jun. 26, 2003 now U.S. Pat. No. 6,870,216.

BACKGROUND OF THE INVENTION

1. Field of the Invention

The invention relates to a floating gate and more particularly to a floating gate with tip of a stack gate vertical memory and a fabricating method thereof.

2. Description of the Related Art

Memory devices for non-volatile storage of information are currently in widespread use, in a myriad of applications. A few examples of non-volatile semiconductor memory include read only memory (ROM), programmable read only memory (PROM), erasable programmable read only memory (EPROM), electrically erasable programmable read only memory (EEPROM) and flash EEPROM.

An advantage of EPROM is that it is electrically programmed, but for erasing, EPROM requires exposure to ultraviolet (UV) light.

In many circuit designs it is desirable to have a non-volatile memory device that can be erased and reprogrammed in-circuit, without the need to remove the device.

EEPROM devices have the advantage of electrical programming and erasing, achieved by charging and discharging actions controlled by the control gate. The actions also affect the conductivity of the channel between source and drain.

One of the advantages of flash memory is its capacity for block-by-block memory erasure. Furthermore, memory erasure is fast, and normally takes just 1 to 2 seconds for the complete removal of a whole block of memory. Another advantage of flash memory is low power consumption.

FIGS. 1a to 1c are cross-sections of the conventional method for forming a stack gate with tip vertical memory. FIG. 1a is a top view, FIG. 1b is a cross section of line XX in FIG. 1a, and FIG. 1c is a cross section of line YY in FIG. 1a.

A semiconductor substrate, such as a silicon substrate, 10 is provided, a drain area 101, such as an ion doped area, a source area 102, such as an ion doped area, a gate dielectric layer 11, such as a gate oxide layer, a conducting layer 12, such as a polysilicon layer or an epi-silicon layer, as a floating gate, a conducting layer 13, such as a polysilicon layer or an epi-silicon layer, as a control gate, a contact 14, such as a Cu layer, for connecting the source 102, a metal layer 15, such as a Cu layer, for connecting the drain area 101, a isolation area 16, such as an STI, and a liner layer 17, such as a liner oxide layer, in the isolation layer 16 are sequentially formed thereon.

When the edge of the floating gate is a tip, the electrical field is easily concentrated, and the point is easily discharged. If the point discharge is increased, the effects of erasure increase.

In addition, the die size is larger due to the addition of programming circuitry and there are more processing and testing steps involved in the manufacture.

SUMMARY OF THE INVENTION

The present invention is directed to a floating gate with tips.

Accordingly, the present invention provides a stack gate with tip vertical memory comprising a semiconductor substrate with a trench, a source conducting layer formed on the bottom of the trench, an insulating layer formed on the source conducting layer, a gate dielectric layer formed on the sidewall of the trench, a conducing spacer covered on the gate dielectric layer as a floating gate, an inter-gate dielectric layer covered on the conducting spacer, and a control gate conducting layer filled in the trench.

Accordingly, the present invention also provides a stack gate with tip vertical memory comprising a semiconductor substrate, a source conducting layer, an insulating layer, a gate dielectric layer, a source area, a drain area, an inter-gate dielectric layer, and a control gate conducting layer. A trench is formed in the semiconductor substrate, and an isolation layer is formed on the bottom of the trench. The source conducting layer and the semiconductor substrate are separated by the isolation layer. The source conducting layer and the others formed on the insulating layer are separated by the insulating layer. The gate dielectric layer is formed on the sidewall of the trench. The conducting spacer covers the gate dielectric layer as a floating gate. The source area is formed on a side of the insulating layer in the semiconductor substrate, and electrically connected to the source conducting layer and the conducting spacer. The drain area is formed on a side of the top of the conducting spacer in the semiconductor substrate. The inter-gate dielectric layer covers the conducting spacer. The control gate dielectric layer is filled in the trench.

The present invention is directed to a method for fabricating a floating gate with tips.

Accordingly, the present invention provides a method for fabricating a stack gate with tip vertical memory. A semiconductor substrate is provided, wherein a trench is formed in the semiconductor substrate. An isolation layer is conformally formed on the bottom of the trench. A source conducting layer is formed on the bottom of the trench, the source conducting layer and the semiconductor substrate are separated by the isolation layer. An ion doped polysilicon layer is conformally formed on the bottom of the trench and the source conducting layer. The ion doped polysilicon layer is annealed to drive the dopant in the semiconductor substrate on the sidewall of the bottom of the trench to form a source area, and the dopant is driven in the source conducting layer to form a common source area. The ion doped polysilicon layer is etched to leave a remaining portion between the source area and the common source area. An insulating layer is formed on the source conducting layer, wherein the source conducting layer and others formed on the insulating layer are separated by the insulating layer. A gate dielectric layer and a conducting spacer are sequentially formed on the sidewall of the trench. The conducting spacer covers the gate dielectric layer as a floating gate, and the top of the conducting spacer is a tip. The top of the conducting spacer is ion implanted to form a drain area on a side of the top of the conducting spacer in the semiconductor substrate. An inter-gate dielectric layer covers the conducting spacer. A control gate dielectric layer is filled in the trench.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1A:
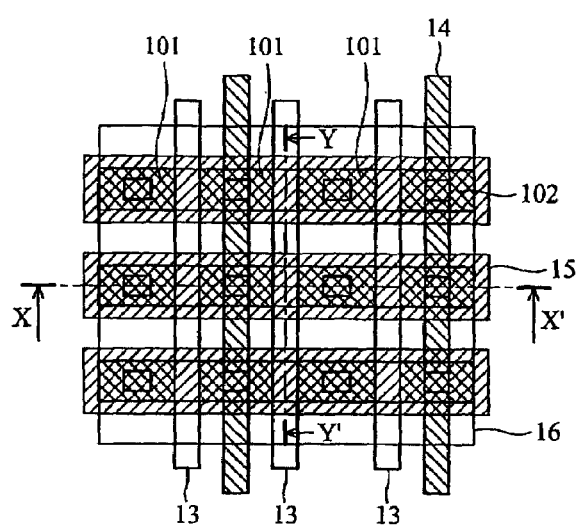
FIGS. 1a to 1c are cross-sections of the conventional method for forming a stack gate with tip vertical memory.
Figure 1B:
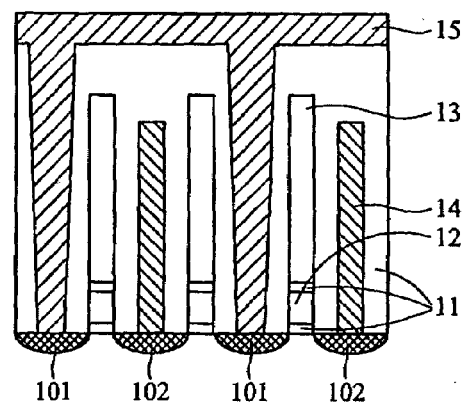
Figure 1C:
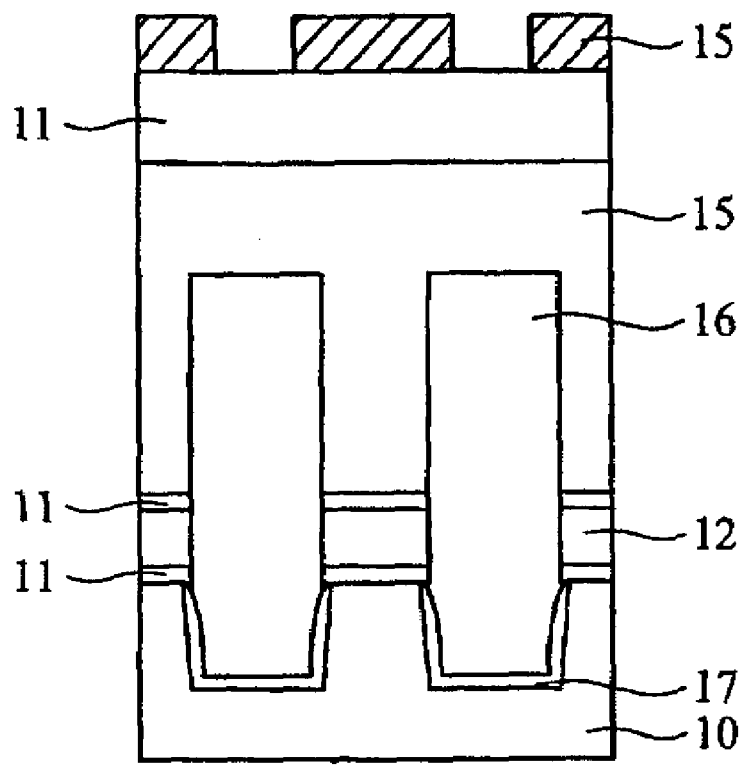
Figure 2A:
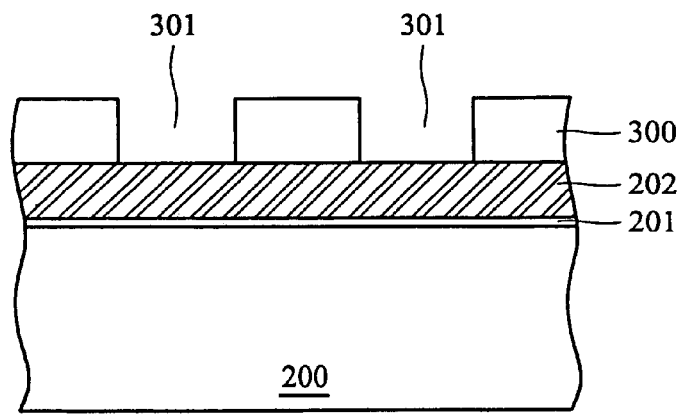
FIGS. 2a to 2i are cross-sections of the method for forming a stack gate with tips of the present invention.

FIGS. 2a to 2i are cross-sections of the method for forming a stack gate with tips of the present invention;

In FIG. 2a, a semiconductor substrate 200 is provided. A pad oxide layer 201, a pad nitride layer 202, and a patterned hard mask layer 300 with an opening 301 are sequentially formed on the semiconductor substrate 200. The position of the opening 301 is the position of a stack gate formed in following process.

Figure 2B:
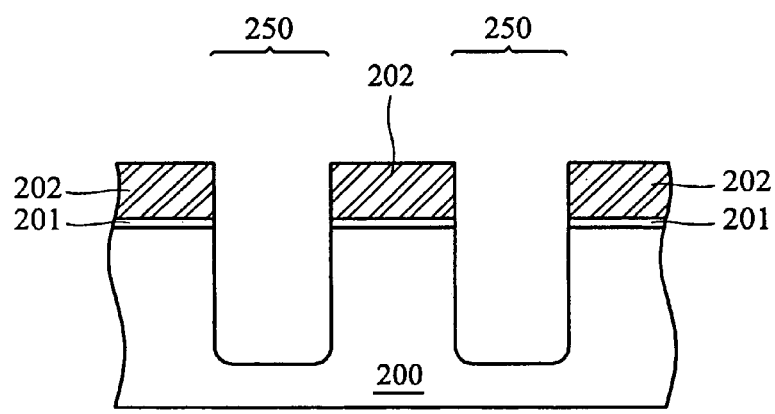

In FIG. 2b, the pad oxide layer 201, the pad nitride layer 202, and the semiconductor substrate 200 are sequentially etched to form a trench 250 using the patterned hard mask layer 300 as a mask.

Figure 2C:
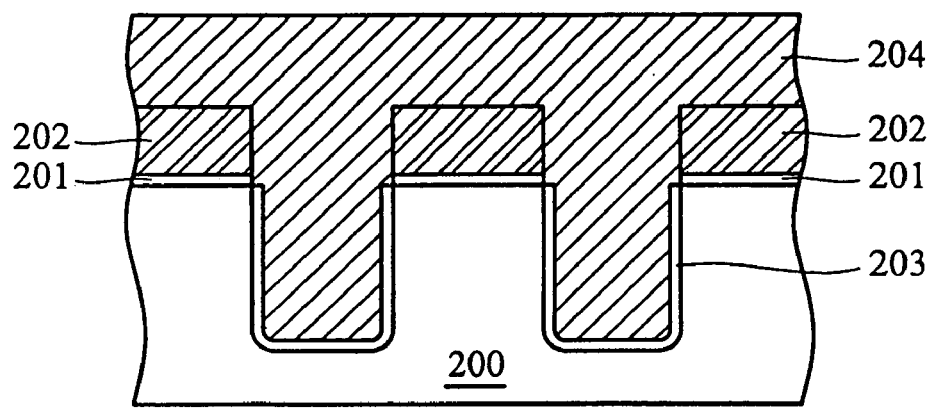

In FIG. 2c, the semiconductor substrate 200 is chemical vapor deposited to form an oxide layer 203 on the sidewall and the bottom of the trench 250. The oxide layer 203 is formed on the exposed semiconductor substrate 200 on the trench 250. A conducting layer 204, such as doped polysilicon or epi-silicon, is formed on the semiconductor substrate 200; the trench 250 is filled with the conducting layer 204.

Figure 2D:
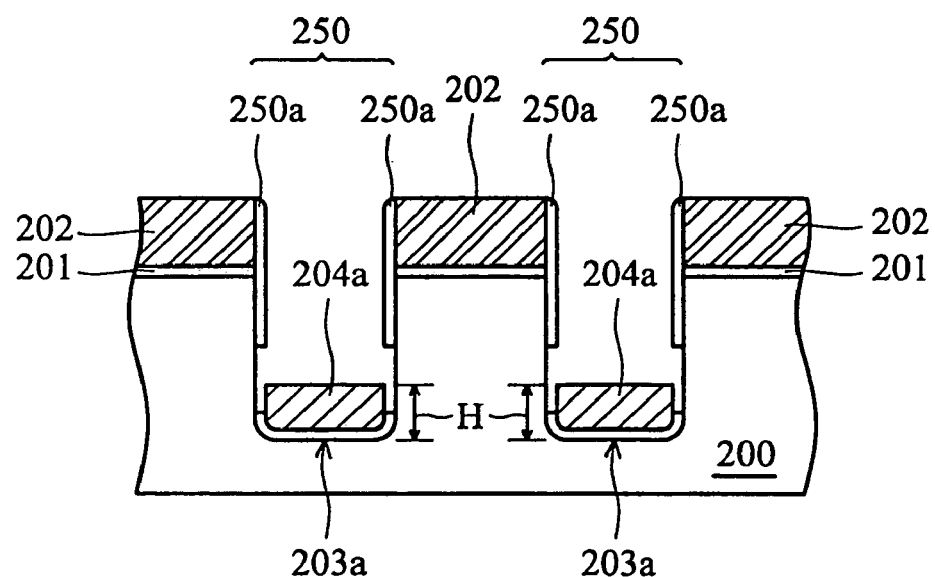

In FIG. 2d, the conducting layer 204 is etched back to the remaining conducting layer 204a on the bottom of the trench 250, wherein the conducting layer 204a is a source of following. The oxide layer 203 is removed but the oxide layer 203a covered by the conducting layer 204a, and the conducting layer 204a and the semiconductor substrate 200 are separated by the oxide layer 203a.

The bottom of the trench 250 is filled with a BSG layer(not shown), and a thin insulating layer (not shown) is conformally formed on the semiconductor substrate 200 and the trench 250. The thin insulating layer is anisotropically etched to form a spacer 250a, such as nitride layer, on the sidewall of the trench 250, and then the BSG layer is removed.

Figure 2E:
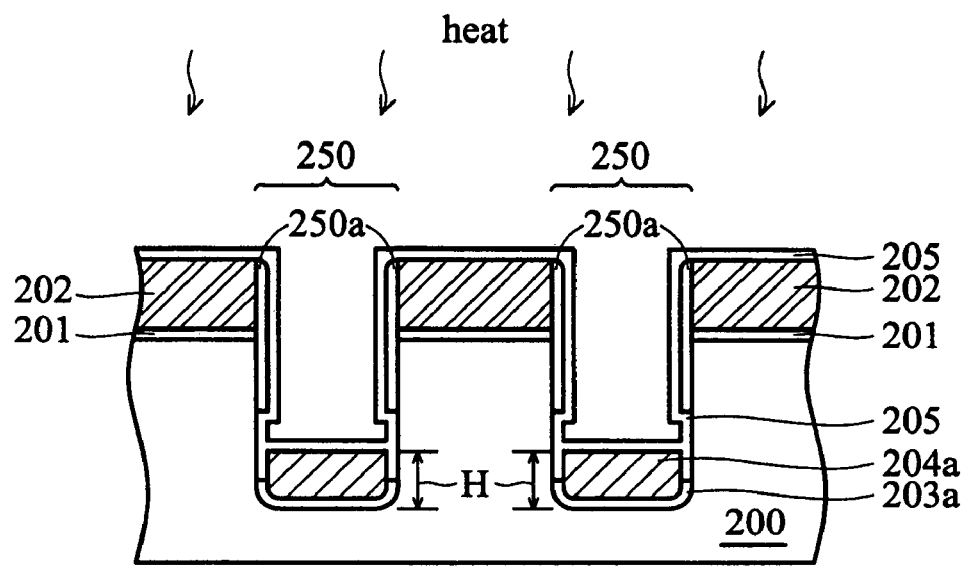

In FIG. 2e, the trench 250 is chemical vapor deposited to form a doped polysilicon layer (not shown) and an insulating layer (not shown) on the sidewall and the bottom of the trench 250, wherein the dopant in the doped polysilicon layer comprises As ions, and the insulating layer comprises an oxide layer. The thickness of the doped polysilicon layer comprises 100 to 300 Å. A photoresist layer (not shown) is formed on the insulating layer, and the exposed insulating layer is etched until a U-shaped doped polysilicon layer 205 is formed on the sidewall and the bottom of the trench. The photoresist layer is then removed.

Figure 2F:
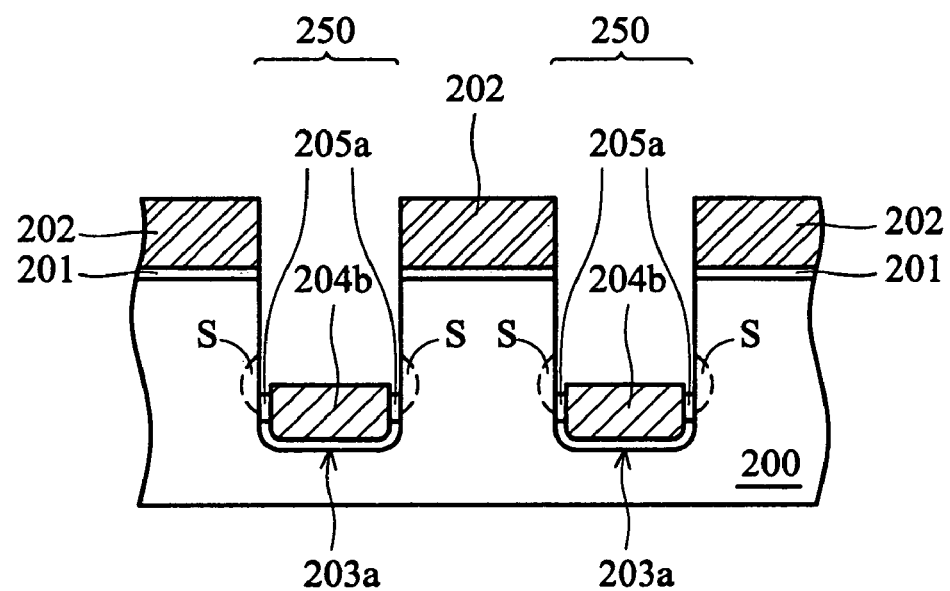

In FIG. 2f, the U-shaped doped polysilicon layer 205 is annealed, and the As ions in the doped polysilicon layer 205 are drive in the sidewall of the trench 250 and the conducting layer 204a to form a source area S and a conducting layer 204b. The conducting layer 204b is the common source in following. The polysilicon layer 205 is wet etched to a doped polysilicon layer 205a on the common source 204b, and connects to the common source 204b.

Figure 2G:
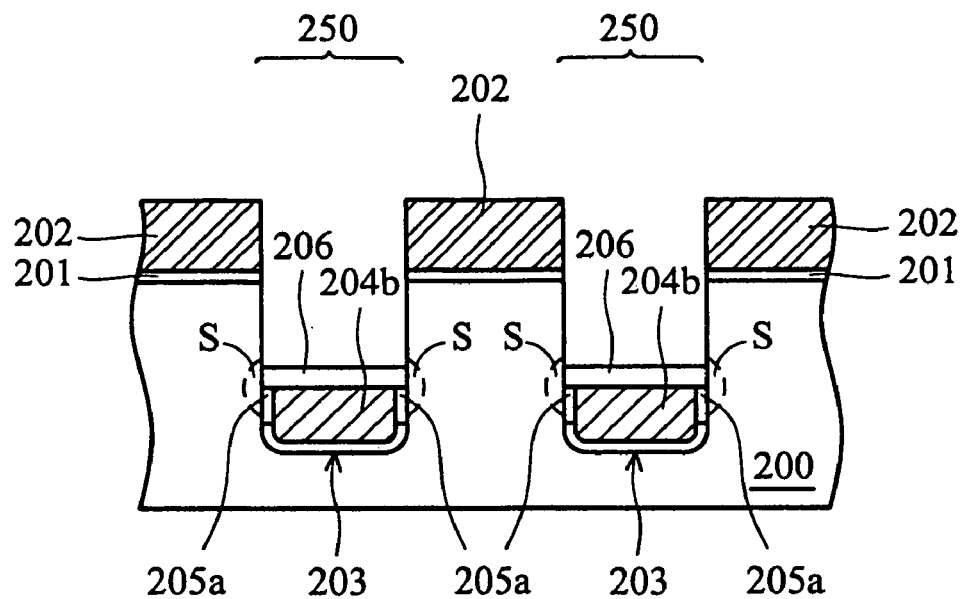

In FIG. 2g, the trench 250 is chemical vapor doped to form an insulating layer on the sidewall of the trench 250 and the conducting layer 204b conformally, wherein the thickness of the insulating layer comprises 150 to 300 Å. A photoresist layer is formed on the bottom of the trench 250. The insulating layer is etched to form an insulating layer 206 on the conducting layer 204b in the trench 250 using the photoresist layer as a mask. The photoresist layer is removed. The insulating layer 206 comprises an oxide layer, and the common source 204b and a floating gate formed in the trench 250 in following steps are separated by the insulating layer 206.

Figure 2H:
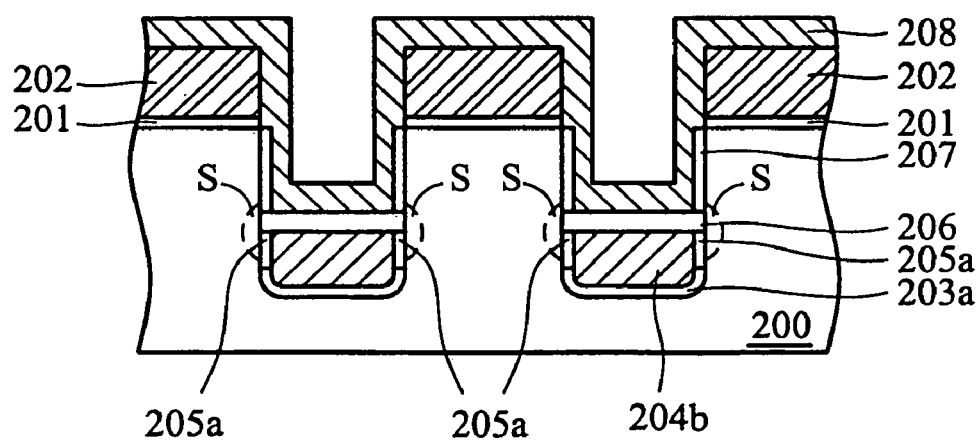

In FIG. 2h, a gate dielectric layer 207, such as a gate oxide layer, and a conducting layer 208, such as a polysilicon layer or an epi-silicon layer, are sequentially formed on the semiconductor substrate 200 in the trench 250, wherein the gate dielectric layer 207 is formed by thermal oxidation.

Figure 2I:
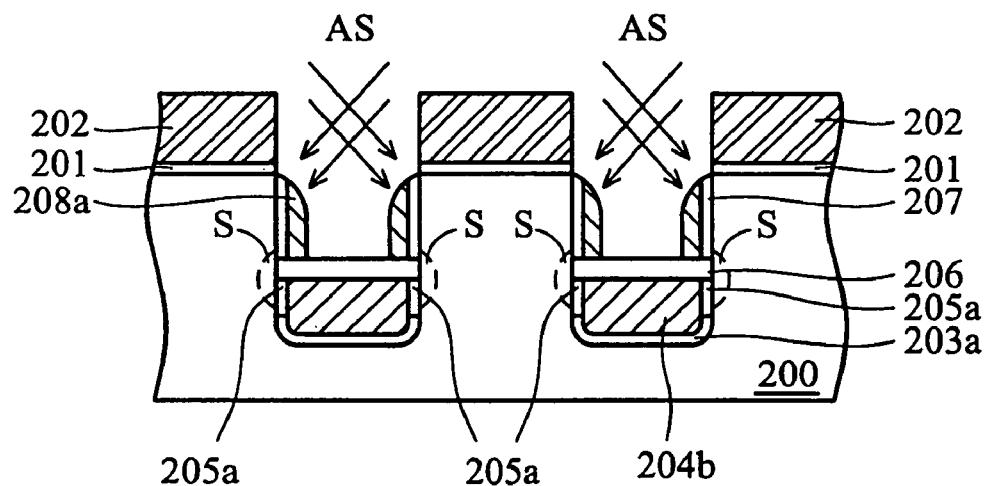

In FIG. 2i, the conducting layer 208 is anisotropically etched to form a spacer 208a on the sidewall of the trench 250; the top of the spacer 208a is a tip, wherein the spacer 208a is a floating gate 208a in the following process. The anisotropically etching comprises a reactive ion etching or a plasma etching.

Figure 2J:
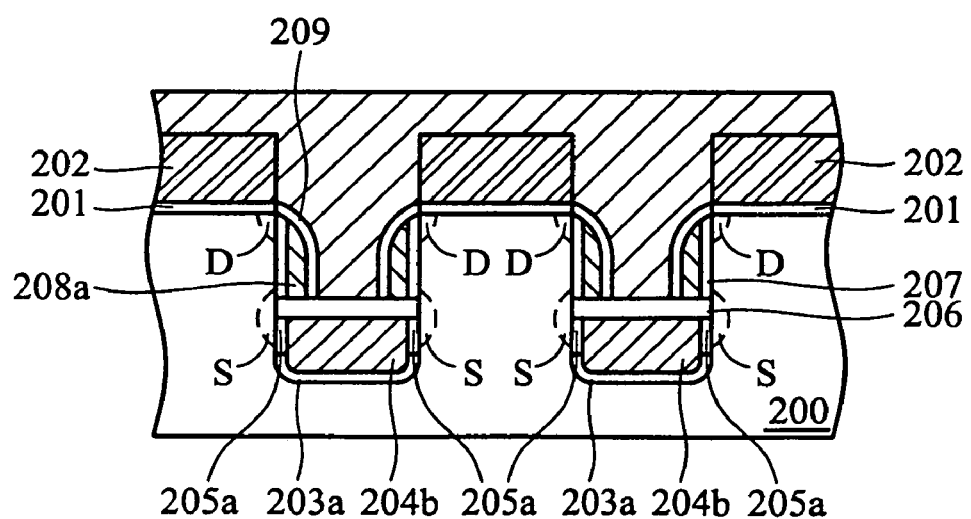
FIG. 2j is cross-section of a vertical memory with the stack gate with tips.

In FIG. 2j, As ions are implanted in the top of the trench 250 at a predetermined angle to form an AS ion doped area on a side of the tip of the floating gate 208a in the semiconductor substrate 200, wherein the As ion doped area is the drain area. The predetermined angle between the anisotropic etching direction and a line perpendicular to the semiconductor substrate comprises 30 to 60.

The floating gate 208a is doped to form an inter-gate dielectric layer 209, and the trench 250 is filled with a conducting layer 210 as a control gate, wherein the inter-gate dielectric layer 209 comprises an oxide layer, and the conducting layer 210 comprises a polysilicon layer or an epi-silicon layer. Therefore, a stack gate with tip vertical memory is complete.

Figure 3:
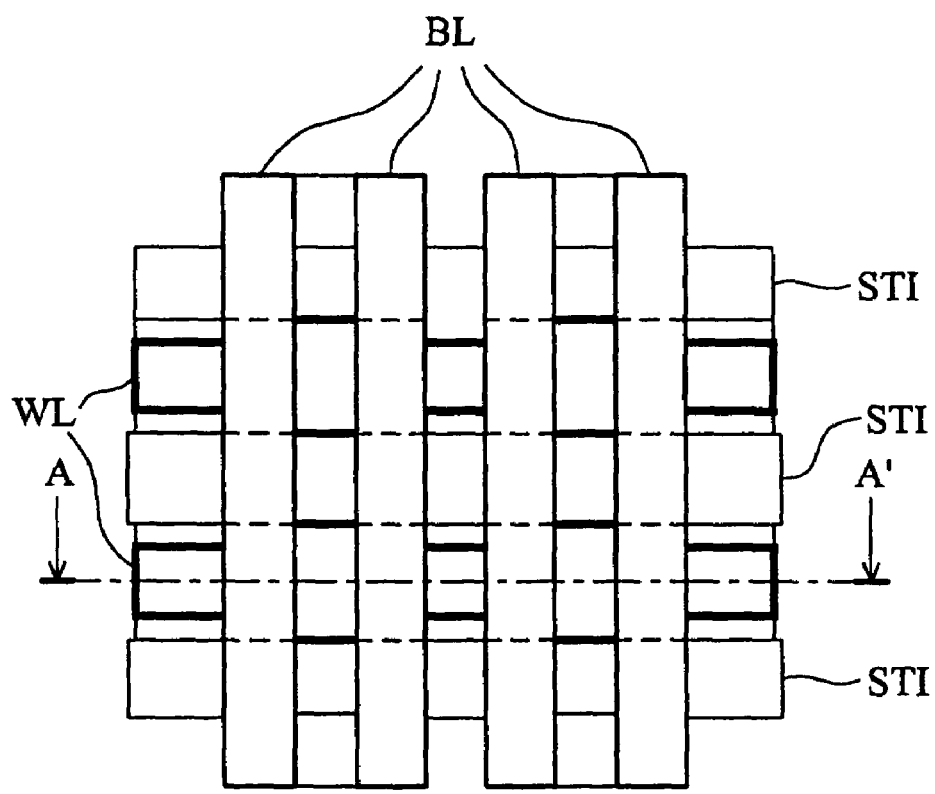
FIG. 3 is a top view of the stack gate with tip vertical memory of the present invention.

FIG. 3 is a top view of the stack gate with tip vertical memory of the present invention.

The stack gate with tip vertical memory of the present invention can be operated after active areas; STI, word line, and bit line are sequentially defined or formed in the following process. FIG. 2j is the cross section of line AA of FIG. 3.

Concentration of the electrical field easily occurs in the tip, and the point is easily discharged. Point discharge is increased because the floating gate has multiple tips in the present invention. Therefore, data erasure in flash memory having a floating gate with multiple tips is increased.

The operation voltage is decreased to ⅔ in programming or erasing of the stack gate with tip vertical memory of the present invention. The processes of the present invention are nearly self aligned and, the number of masks is reduced, simplifying the process and reducing cost.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a stacked gate vertical flash memory, comprising:
    providing a semiconductor substrate, wherein a trench is formed in the semiconductor substrate;
    conformally forming an isolation layer on a bottom of the trench;
    forming a source conducting layer on the bottom of the trench, wherein the source conducting layer and the semiconductor substrate are separated by the isolation layer;
    conformally forming an ion doped polysilicon layer on a sidewall of the trench and the source conducting layer;
    annealing the ion doped polysilicon layer, wherein the dopant is driven in to the semiconductor substrate of the bottom of the trench to form a source area, the dopant is driven in the source conducting layer to form a common source area;
    etching the ion doped polysilicon layer to leave a remaining portion between the source area and the common source area;
    forming an insulating layer on the source conducting layer, wherein the source conducting layer and others formed thereon are separated by the insulating layer;
    sequentially forming a gate dielectric layer and a conducting spacer on the sidewall of the trench, wherein the conducting layer covers the gate dielectric layer as a floating gate, and a top portion of the conducting spacer is a tip;
    dopant implanting into the top of the conducting spacer to form a drain area on a side of the top of the conducting spacer in the semiconductor substrate;
    forming an inter-gate dielectric layer covering the conducting layer; and
    filling a control gate layer in the trench.

2. The method for fabricating a stacked gate vertical flash memory as claimed in claim 1, wherein the source conducting layer comprises a polysilicon layer or an epi-silicon layer.

3. The method for fabricating a stacked gate vertical flash memory as claimed in claim 1, wherein the insulating layer comprises an oxide layer.

4. The method for fabricating a stacked gate vertical flash memory as claimed in claim 1, wherein the gate dielectric layer comprises a gate oxide layer.

5. The method for fabricating a stacked gate vertical flash memory as claimed in claim 1, wherein the conducting spacer comprises a polysilicon layer or an epi-silicon layer.

6. The method for fabricating a stacked gate vertical flash memory as claimed in claim 1, wherein the dopant comprises As ions.

7. The method for fabricating a stacked gate vertical flash memory as claimed in claim 1, wherein the inter-gate dielectric layer comprises a gate oxide layer.

8. The method for fabricating a stacked gate vertical flash memory as claimed in claim 1, wherein the control gate conducting layer comprises a polysilicon layer or an epi-silicon layer.

* * * * *